United States Patent [19]
Fukunaga

[11] Patent Number: 5,657,339
[45] Date of Patent: Aug. 12, 1997

[54] INTEGRATED OPTICS SEMICONDUCTOR LASER DEVICE

[75] Inventor: Toshiaki Fukunaga, Kanagawa-ken, Japan

[73] Assignee: Fuji Photo Film Co. Ltd., Kanagawa, Japan

[21] Appl. No.: 569,292

[22] Filed: Dec. 8, 1995

[30] Foreign Application Priority Data

Dec. 27, 1994 [JP] Japan ................... 6-325840

[51] Int. Cl.$^6$ ...................................... H01S 3/19
[52] U.S. Cl. ................. 372/50; 372/45; 372/46
[58] Field of Search ................... 372/50, 45, 46

[56] References Cited

U.S. PATENT DOCUMENTS

| | | | |
|---|---|---|---|
| 4,744,089 | 5/1988 | Montroll et al. | 372/50 |
| 4,856,017 | 8/1989 | Unger | 372/96 |
| 5,084,892 | 1/1992 | Hayakawa | 372/46 |

FOREIGN PATENT DOCUMENTS 5-218594   8/1993   Japan ................. H01S 3/18

OTHER PUBLICATIONS

IEEE Journal of Quantum Electronics, vol. 29, No. 6 Jun. 1993 "Operating Characteristics of High–Power Monolithically Integrated Flared Amplifier Master Oscillator Power Amplifier" pp. 2052–2057 by O'Brien et al.

Primary Examiner—Rodney B. Bovernick
Assistant Examiner—Luong-Quyen T. Phan
Attorney, Agent, or Firm—Sughrue, Mion, Zinn, Macpeak & Seas

[57] ABSTRACT

An integrated optics semiconductor laser device comprises, combined with one another, a light emitting section, a diffraction grating for controlling the wavelength of a produced laser beam, and an optical amplifier, which has a tapered portion, that confines a guided optical wave therein, and in which an optical wave is guided with refractive index wave guiding through an active medium. Unevenness is formed on side surfaces of the tapered portion, which side surfaces extend in a direction along which the optical wave is guided. The integrated optics semiconductor laser device can be controlled to produce a laser beam in the fundamental transverse mode even under the conditions for radiating a laser beam having a high intensity.

6 Claims, 5 Drawing Sheets

INTEGRATED OPTICS SEMICONDUCTOR LASER DEVICE

BACKGROUND OF THE INVENTION

1. Field of the Invention

This invention relates to an integrated optics semiconductor laser device comprising a light emitting means, a diffraction grating for controlling the wavelength of a produced laser beam, and an optical amplifier, which are combined with one another. This invention particularly relates to an integrated optics semiconductor laser device, wherein adverse effects of an optical wave returning from an end face of the optical amplifier are kept small.

2. Description of the Prior Art

There have heretofore been proposed various semiconductor laser devices, which have a high output power and are controlled to produce a laser beam in a fundamental transverse mode. One example of such semiconductor laser devices is an integrated optics semiconductor laser device disclosed in, for example, U.S. Pat. No. 4,744,089. The disclosed integrated optics semiconductor laser device comprises, combined together, a master generator, which is constituted of a distributed feedback laser (hereinbelow referred to as the DFB laser) having a diffraction grating for controlling the wavelength of the produced laser beam, and an optical amplifier, which has a tapered (i.e., progressively widened) active region and has an anti-reflection film coated on an optical wave radiating end face.

Also, for example, Japanese Unexamined Patent Publication No. 5(1993)-218594 discloses an integrated optics semiconductor laser device comprising a DFB generator, a pre-amplifier, and an optical amplifier having a tapered active region, which are respectively provided with independent electrical contacts and are driven by independent current sources. With the disclosed constitution, the control operation range for the laser beam radiated from the generator can be kept wide, and the oscillation in the fundamental transverse mode can be carried out on a comparatively high level.

Further, a different example of an integrated optics semiconductor laser device is proposed in, for example, "IEEE Journal of Quantum Electronics," Vol. 29, No. 6, pp. 2052-2057, 1993. The proposed integrated optics semiconductor laser device comprises a master generator, in which the wavelength of a produced laser beam is controlled by a diffraction grating as described above, and an optical amplifier, which is combined with the master generator.

Furthermore, for example, U.S. Pat. No. 4,856,017 discloses an integrated optics semiconductor laser device comprising (i) an optical amplifier provided with a tapered active gain medium layer, which has a wide output face coated with an anti-reflection film at one end and has a comparatively narrow region at the other end, the comparatively narrow region undergoing oscillation in the fundamental transverse mode, (ii) a diffraction grating for controlling the wavelength of a produced laser beam, and (iii) a means for causing a wavelength-dependent feedback to occur in the active gain medium layer.

However, the conventional integrated optics semiconductor laser devices having an optical amplifier, in which an optical wave is guided through the tapered active medium portion as described above, have the drawbacks in that they cannot always be controlled to produce a laser beam in the fundamental transverse mode under the conditions for radiating a laser beam having a high intensity. In "IEEE Journal of Quantum Electronics," Vol. 29, No. 6, pp. 2052-2057, 1993, it is reported that a diffraction limit optical wave of a 2 W level was achieved. However, actually, only the products having an output power of at most 1 W level have heretofore been used in practice.

SUMMARY OF THE INVENTION

The object of the present invention is to provide an integrated optics semiconductor laser device, which is capable of being controlled to produce a laser beam in the fundamental transverse mode even under the conditions for radiating a laser beam having a high intensity.

The present invention provides an integrated optics semiconductor laser device comprising, combined with one another:

i) a light emitting means, ii) a diffraction grating for controlling the wavelength of a produced laser beam, and iii) an optical amplifier, which has a tapered portion, that confines a guided optical wave therein, and in which an optical wave is guided with refractive index wave guiding through an active medium, wherein unevenness is formed on side surfaces of the tapered portion, the side surfaces extending in a direction along which the optical wave is guided.

In the integrated optics semiconductor laser device in accordance with the present invention, the light emitting means may be constituted of the master generator described above or the active medium portion of the optical amplifier.

Also, a cladding layer, which is formed on the side outward from either one of optical waveguide layers located with the active medium interleaved therebetween, may constitute the tapered portion. Alternatively, either one of optical waveguide layers, which are located with the active medium interleaved therebetween, may constitute the tapered portion. As another alternative, the active medium may be formed in a tapered shape and may constitute the tapered portion.

The inventors carried out intensive research and found that the drawbacks of the conventional integrated optics semiconductor laser devices in that they cannot always be controlled to produce a laser beam in the fundamental transverse mode under the conditions for radiating a laser beam having a high intensity are due to an optical wave returning from the optical wave radiating end face of the optical amplifier.

Specifically, though the optical wave radiating end face of the optical amplifier is coated with an anti-reflection film, the actual reflectivity of the anti-reflection film is not equal to zero. Therefore, under the conditions for radiating a laser beam having a high intensity, an optical wave returning from the optical wave radiating end face of the optical amplifier occurs. Also, the gain of the tapered active medium is very large. Therefore, with the conventional integrated optics semiconductor laser devices, a resonance mode occurs due to reflection of the optical wave from the side surfaces of the tapered active medium. Due to the resonance mode, the oscillation in the fundamental transverse mode is disturbed. As a result, it becomes difficult for the integrated optics semiconductor laser device to be controlled to produce a laser beam in the fundamental transverse mode under the conditions for radiating a laser beam having a high intensity.

On the other hand, with the integrated optics semiconductor laser device in accordance with the present invention, unevenness is formed on the side surfaces of the tapered portion, that confines the guided optical wave therein, the side surfaces extending in the direction along which the optical wave is guided. Therefore, when the optical wave returning from the optical wave radiating end face of the optical amplifier impinges upon the uneven side surfaces of the tapered portion, the returning optical wave is scattered by the uneven side surfaces of the tapered portion, and the intensity of the returning optical wave is lost. As a result, the resonance mode of the returning optical wave does not occur. Accordingly, the oscillation in the fundamental transverse mode is not disturbed by the resonance mode of the returning optical wave, and the integrated optics semiconductor laser device can be controlled to produce a laser beam in the fundamental transverse mode even under the conditions for radiating a laser beam having a high intensity.

DESCRIPTION OF THE PREFERRED EMBODIMENTS

The present invention will hereinbelow be described in further detail with reference to the accompanying drawings.

Figure 1:
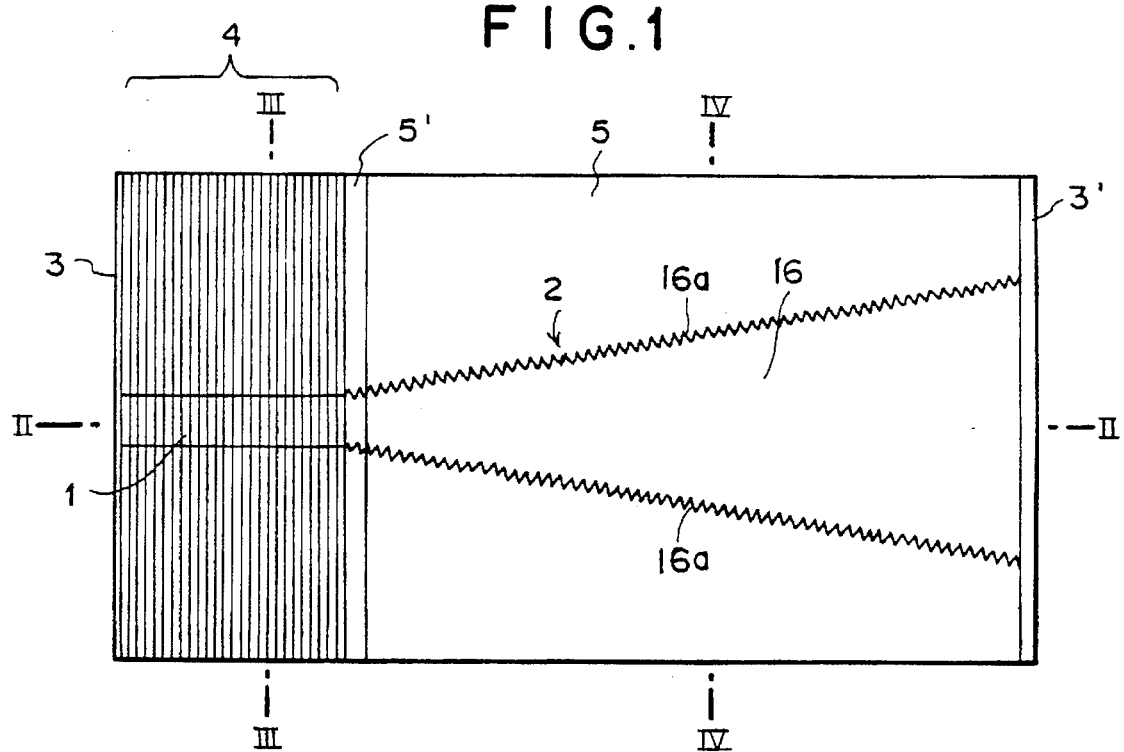
FIG. 1 is a schematic plan view showing a first embodiment of the integrated optics semiconductor laser device in accordance with the present invention.
Figure 2:
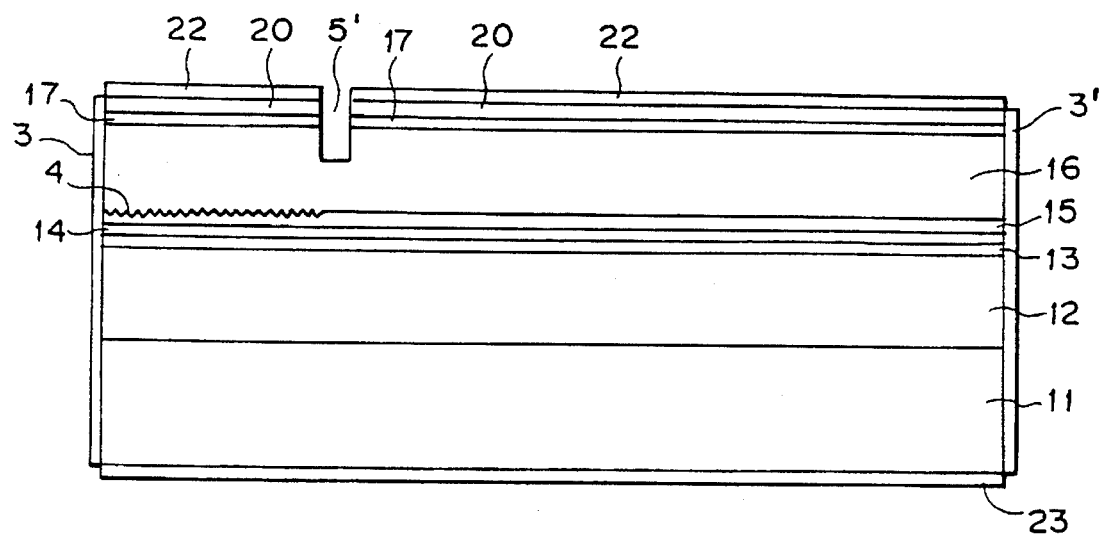
FIG. 2 is a sectional view taken along line I–I' of FIG. 1.
Figure 3:
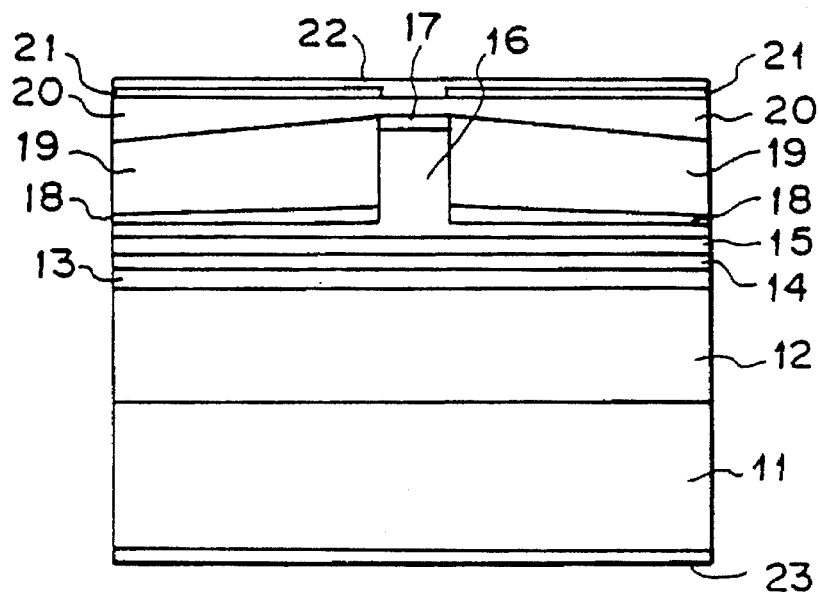
FIG. 3 is a sectional view taken along line II–II' of FIG. 1.
Figure 4:
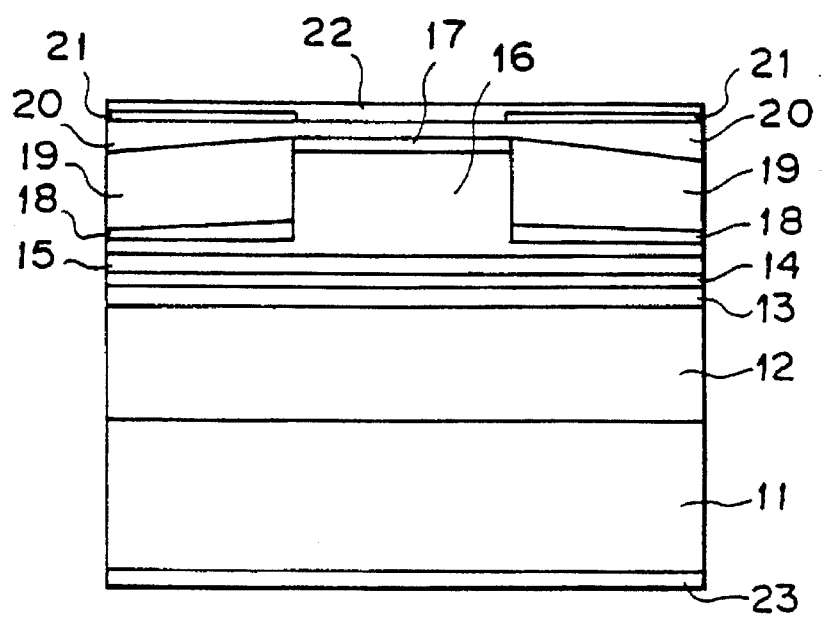
FIG. 4 is a sectional view taken along line III–III' of FIG. 1.

A first embodiment of the integrated optics semiconductor laser device in accordance with the present invention will be described hereinbelow with reference to FIGS. 1, 2, 3, and 4. FIG. 1 is a schematic plan view showing the first embodiment of the integrated optics semiconductor laser device in accordance with the present invention. FIG. 2 is a sectional view taken along line I–I' of FIG. 1. FIG. 3 is a sectional view taken along line II–II' of FIG. 1. FIG. 4 is a sectional view taken along line III–III' of FIG. 1.

The first embodiment of the integrated optics semiconductor laser device in accordance with the present invention comprises an n-GaAs substrate 11, an n-$Al_{x1}Ga_{1-x1}As$ cladding layer 12, an $Al_{x2}Ga_{1-x2}As$ optical waveguide layer 13, an $Al_{x3}Ga_{1-x3}As$ active layer 14, an $Al_{x2}Ga_{1-x2}As$ optical waveguide layer 15, a p-$Al_{x1}Ga_{1-x1}As$ cladding layer 16, and a p-GaAs capping layer 17, which layers are grown in this order on the n-GaAs substrate 11. The cladding layer 16 and the capping layer 17 are formed in a ridge-like shape. A p-$In_{x4}(Ga_{1-z4}Al_{z4})_{1-x4}As_{1-y4}P_{y4}$ selectively embedded layer 18 (wherein $0 \leq z4 \leq 1$, $x4 \leftrightarrow 0.49y4$) is formed on the sides outward from the side surfaces of the ridge-like layers 16 and 17. Also, an n-$In_{x4}(Ga_{1-z4}Al_{z4})_{1-x4}As_{1-y4}P_{y4}$ selectively embedded layer 19 (wherein $0 \leq z4 \leq 1$, $x4 \leftrightarrow 0.49y4$) is formed on the sides outward from the side surfaces of the ridge-like layers 16 and 17. Further, a p-GaAs contact layer 20 is formed on the capping layer 17 and the selectively embedded layer 19. An insulating film 21 is formed on the contact layer 20 in the regions, which are approximately matched with the regions of the selectively embedded layer 19, as viewed from above. A p-side electrode 22 is formed on the insulating film 21 and on the region of the contact layer 20, which region is not covered with the insulating film 21. Ann-side electrode 23 is formed on the bottom surface of the substrate 11.

How the integrated optics semiconductor laser device is produced and its detailed structure will be described hereinbelow.

Firstly, the n-$Al_{x1}Ga_{1-x1}As$ cladding layer 12, the $Al_{x2}Ga_{1-x2}As$ optical waveguide layer 13, the $Al_{x3}Ga_{1-x3}As$ active layer 14, and the $Al_{x2}Ga_{1-x2}As$ optical waveguide layer 15 are successively grown on the n-GaAs substrate 11 with a metalorganic chemical vapor deposition process (MO-CVD). Also, a first- or second-order diffraction grating 4 is formed on a portion of the region of the $Al_{x2}Ga_{1-x2}As$ optical waveguide layer 15 with a dry or wet etching technique by utilizing the ordinary interference exposure method or the ordinary electron beam exposure method.

Thereafter, the p-$Al_{x1}Ga_{1-x1}As$ cladding layer 16 and the p-GaAs capping layer 17 are grown on the $Al_{x2}Ga_{1-x2}As$ optical waveguide layer 15. With the ordinary lithographic technique, an insulating film is then patterned in a stripe-like shape such that the insulating film may have a constant width of approximately 3 μm on the diffraction grating 4 and may continuously extend in a tapered (i.e., progressively widened) shape from the end of the diffraction grating 4. The insulating film having thus been patterned is utilized as a mask, and the regions of the p-$Al_{x1}Ga_{1-x1}As$ cladding layer 16 and the p-GaAs capping layer 17, which regions extend from the side edges of the layers midway toward the middle points of the layers, are removed with a dry or wet etching technique. At this time, the p-$Al_{x1}Ga_{1-x1}As$ cladding layer 16 is removed only to a predetermined depth, and a predetermined thickness of the p-$Al_{x1}Ga_{1-x1}As$ cladding layer 16 may remain unremoved. In this manner, a ridge stripe is formed. The aforesaid insulating film is patterned such that each of the side edges of the tapered portion of the insulating film may be inclined at an angle of approximately 6° and may have unevenness.

Thereafter, the p-$In_{x4}(Ga_{1-z4}Al_{z4})_{1-x4}As_{1-y4}P_{y4}$ layer 18 and the n-$In_{x4}(Ga_{1-z4}Al_{z4})_{1-x4}As_{1-y4}P_{y4}$ layer 19 are selectively embedded by utilizing the aforesaid insulating film as the mask. The p-$In_{x4}(Ga_{1-z4}Al_{z4})_{1-x4}As_{1-y4}P_{y4}$ selectively embedded layer 18 has the composition such that its refractive index may be smaller than the refractive index of the p-$Al_{x1}Ga_{1-x1}As$ cladding layer 16. Also, the remaining thickness of the p-$Al_{x1}Ga_{1-x1}As$ cladding layer 16 is set such that, in the optical waveguide of a DFB laser 1 having the narrow-width ridge stripe structure, the refractive index wave guiding in the single fundamental mode can be achieved even under the conditions for radiating a laser beam having a high intensity.

The aforesaid insulating film is then removed, the p-GaAs contact layer 20 is grown, and the insulating film 21 is formed on the p-GaAs contact layer 20. Thereafter, the portion of the insulating film 21, which portion corresponds to the ridge stripe including the tapered stripe constituting an optical amplifier 2, is removed. Also, the p-side electrode 22 is formed on the insulating film 21 and the portion of the p-GaAs contact layer 20, which portion corresponds to the removed portion of the insulating film 21. Further, the n-side electrode 23 is formed on the bottom surface of the substrate 11.

The p-side electrode 22 is separated into two portions at a position in the vicinity of the boundary between the DFB laser 1 and the optical amplifier 2 such that the DFB laser 1 and the optical amplifier 2 may have independent electrical contacts. Also, at the position in the vicinity of the boundary between the DFB laser 1 and the optical amplifier 2, the portions ranging from the insulating film 21 to a certain depth in the p-$Al_{x1}Ga_{1-x1}As$ cladding layer 16 are removed by an etching technique. In this manner, an element separating region 5' is formed such that the elements on opposite sides of the element separating region 5' can be driven independently. Further, the opposite end faces of the integrated optics semiconductor laser device are coated with anti-reflection coating films 3 and 3'.

In the integrated optics semiconductor laser device having the constitution described above, the optical wave is produced by the DFB laser 1 in the single fundamental mode, impinges upon the optical amplifier 2 at a certain angle of diffraction, and is amplified by the optical amplifier 2. A laser beam having a high intensity is thereby radiated while the single transverse mode is being kept. The cladding layer 16 formed in the ridge stripe-like shape has a composition such that its refractive index may be larger than the refractive index of the selectively embedded layer 18, which is located on opposite sides of the cladding layer 16. Therefore, the optical wave, which is amplified by the optical amplifier 2, is approximately confined in the region within the ridge width of the cladding layer 16 and guided with the refractive index wave guiding through the active layer 14.

In this integrated optics semiconductor laser device, when the ridge stripe is formed, the insulating film having the unevenness at the side edges as described above is used as the mask. Therefore, fine unevenness 16a is formed on the side surfaces of the tapered portion of the cladding layer 16, which side surfaces extend in the direction along which the optical wave is guided. Since the unevenness 16a is thus formed, when the optical wave returning from the optical wave radiating end face of the optical amplifier 2 (i.e., the end face coated with the anti-reflection coating film 3') impinges upon the uneven side surfaces of the cladding layer 16, the returning optical wave is scattered by the uneven side surfaces of the cladding layer 16, and the intensity of the returning optical wave is lost. As a result, the resonance mode of the returning optical wave does not occur. Accordingly, the oscillation in the fundamental transverse mode is not disturbed by the resonance mode of the returning optical wave, the fundamental transverse mode can be kept even under the conditions for radiating a laser beam having a high intensity, and the diffraction limit optical wave can be produced.

Figure 5:
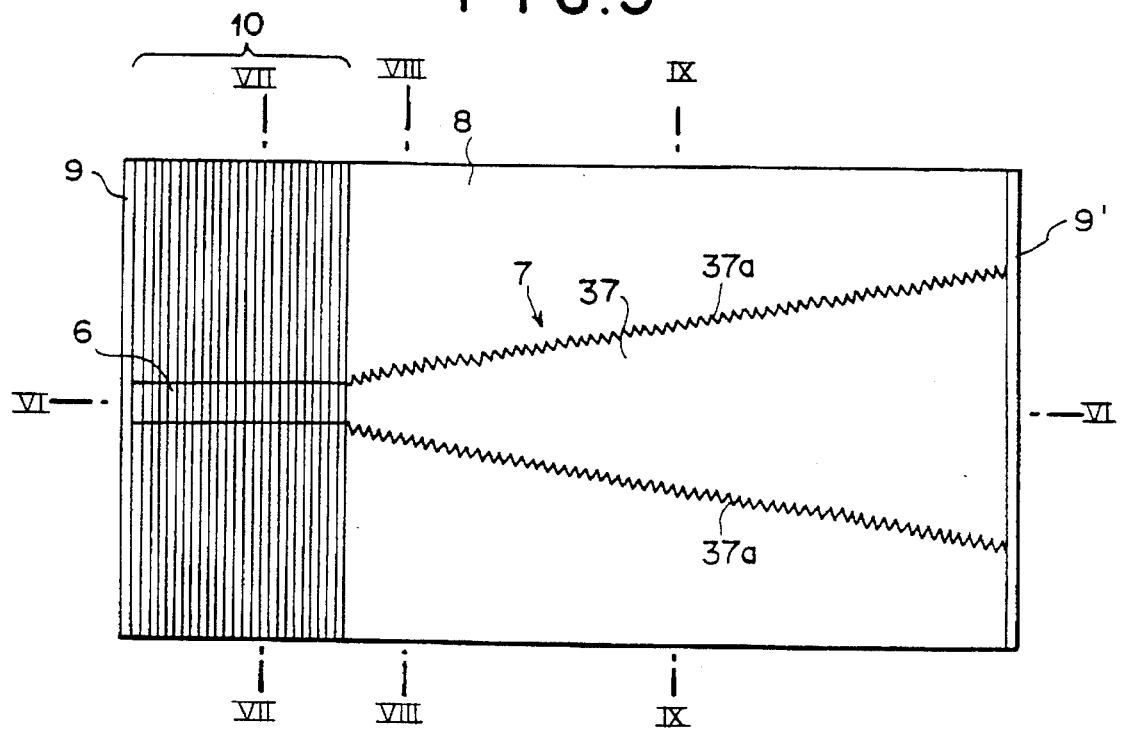
FIG. 5 is a schematic plan view showing a second embodiment of the integrated optics semiconductor laser device in accordance with the present invention.
Figure 6:
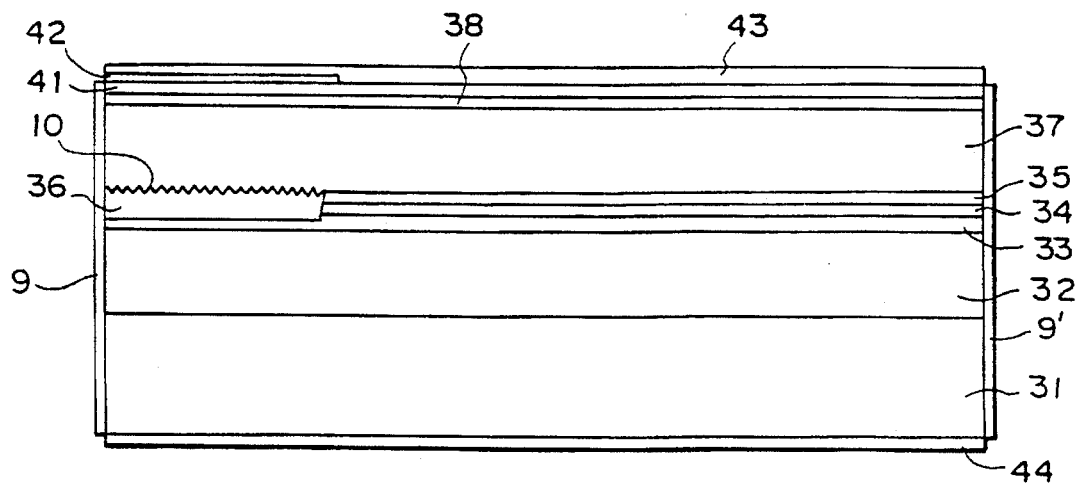
FIG. 6 is a sectional view taken along line I–I' of FIG. 5.
Figure 7:
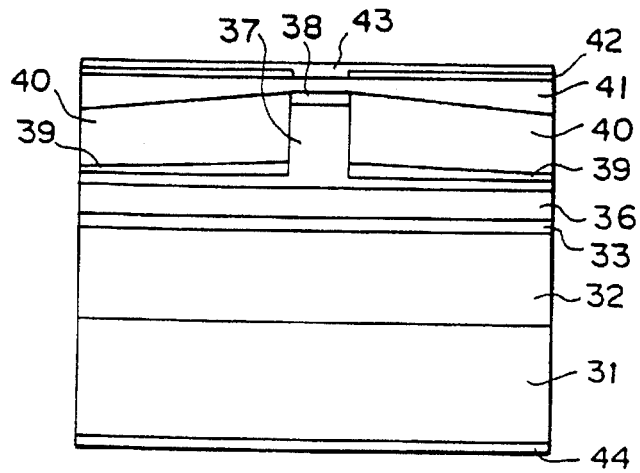
FIG. 7 is a sectional view taken along line II–II' of FIG. 5.
Figure 8:
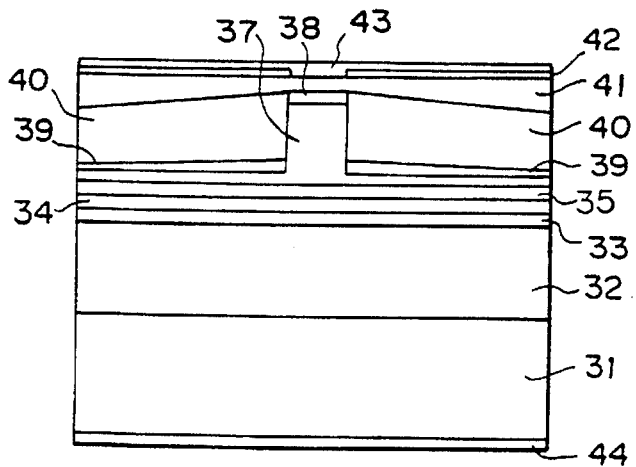
FIG. 8 is a sectional view taken along line III–III' of FIG. 5.
Figure 9:
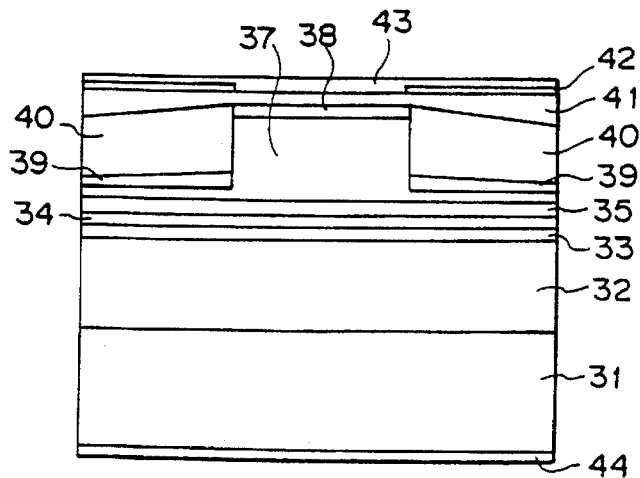
FIG. 9 is a sectional view taken along line IV–IV' of FIG. 5.

A second embodiment of the integrated optics semiconductor laser device in accordance with the present invention will be described hereinbelow with reference to FIGS. 5, 6, 7, 8, and 9. FIG. 5 is a schematic plan view showing the second embodiment of the integrated optics semiconductor laser device in accordance with the present invention. FIG. 6 is a sectional view taken along line I–I' of FIG. 5. FIG. 7 is a sectional view taken along line II–II' of FIG. 5. FIG. 8 is a sectional view taken along line III–III' of FIG. 5. FIG. 9 is a sectional view taken along line IV–IV' of FIG. 5.

The second embodiment of the integrated optics semiconductor laser device in accordance with the present invention comprises an n-GaAs substrate 31, an n-$Al_{x1}Ga_{1-x1}As$ cladding layer 32, an $Al_{x2}Ga_{1-x2}As$ optical waveguide layer 33, an $Al_{x3}Ga_{1-x3}As$ active layer 34, an $Al_{x2}Ga_{1-x2}As$ optical waveguide layer 35, a p-$Al_{x1}Ga_{1-x1}As$ cladding layer 37, and a p-GaAs capping layer 38, which layers are grown in this order on the n-GaAs substrate 31. The cladding layer 37 and the capping layer 38 are formed in a ridge-like shape. A p-$In_{x4}(Ga_{1-z4}Al_{z4})_{1-x4}As_{1-y4}P_{y4}$ selectively embedded layer 39 (wherein $0 \leq z4 \leq 1$, x4+0.49y4) is formed on the sides outward from the side surfaces of the ridge-like layers 37 and 38. Also, an n-$In_{x4}(Ga_{1-z4}Al_{z4})_{1-x4}As_{1-y4}P_{y4}$ selectively embedded layer 40 (wherein $0 \leq z4 \leq 1$, x4+0.49y4) is formed on the sides outward from the side surfaces of the ridge-like layers 37 and 38. Further, a p-GaAs contact layer 41 is formed on the capping layer 38 and the selectively embedded layer 40. An insulating film 42 is formed on the contact layer 41 in the regions, which are approximately matched with the regions of the selectively embedded layer 40, as viewed from above. A p-side electrode 43 is formed on the insulating film 42 and on the region of the contact layer 41, which region is not covered with the insulating film 42. An n-side electrode 44 is formed on the bottom surface of the substrate 31.

How the integrated optics semiconductor laser device is produced and its detailed structure will be described hereinbelow.

Firstly, the n-$Al_{x1}Ga_{1-x1}As$ cladding layer 32, the $Al_{x2}Ga_{1-x2}As$ optical waveguide layer 33, the $Al_{x3}Ga_{1-x3}As$ active layer 34, and the $Al_{x2}Ga_{1-x2}As$ optical waveguide layer 35 are successively grown on the n-GaAs substrate 31 with the metalorganic chemical vapor deposition process (MO-CVD). Thereafter, with ordinary lithographic and etching techniques, an insulating film is formed in the region other than the region, in which a diffraction grating 10 is to be formed, and the portions ranging from the $Al_{x2}Ga_{1-x2}As$ optical waveguide layer 35 to a certain depth in the $Al_{x2}Ga_{1-x2}As$ optical waveguide layer 33 are removed by utilizing the insulating film as the mask. An $Al_{x2}Ga_{1-x2}As$ optical waveguide layer 36 is then grown and embedded by utilizing the insulating film as the mask. Also, the first- or second-order diffraction grating 10 is formed on the $Al_{x1}Ga_{1-x2}As$ optical waveguide layer 36 with a dry or wet etching technique by utilizing the ordinary interference exposure method or the ordinary electron beam exposure method.

Thereafter, the aforesaid insulating film, a resist, or the like, is removed, and the p-$Al_{x1}Ga_{1-x1}As$ cladding layer 37 and the p-GaAs capping layer 38 are grown on the $Al_{x2}Ga_{1-x2}As$ optical waveguide layer 35 and the diffraction grating 10. With the ordinary lithographic technique, an insulating film is then patterned in a—stripe-like shape such that the insulating film may have a constant width of approximately 3 μm on the diffraction grating 10 and may continuously extend in a tapered (i.e., progressively widened) shape from the end of the diffraction grating 10. The insulating film having thus been patterned is utilized as a mask, and the regions of the p-$Al_{x1}Ga_{1-x1}As$ cladding layer 37 and the p-GaAs capping layer 38, which regions extend from the side edges of the layers midway toward the middle points of the layers, are removed with a dry or wet etching technique. At this time, the p-$Al_{x1}Ga_{1-x1}As$ cladding layer 37 is removed only to a predetermined depth, and a predetermined thickness of the p-$Al_{x1}Ga_{1-x1}As$ cladding layer 37 may remain unremoved. In this manner, a ridge stripe is formed. The aforesaid insulating film is patterned such that each of the side edges of the tapered portion of the insulating film may be inclined at an angle of approximately 6° and may have unevenness.

Thereafter, the p-In$_{x4}$(Ga$_{1-z4}$Al$_{z4}$)$_{1-x4}$As$_{1-y4}$P$_{y4}$ layer 39 and the n-In$_{x4}$(Ga$_{1-z4}$Al$_{z4}$)$_{1-x4}$As$_{1-y4}$P$_{y4}$ layer 40 are selectively embedded by utilizing the aforesaid insulating film as the mask. The p-In$_{x4}$(Ga$_{1-z4}$Al$_{z4}$)$_{1-x4}$As$_{1-y4}$P$_{y4}$ selectively embedded layer 39 has the composition such that its refractive index may be smaller than the refractive index of the p-Al$_{x1}$Ga$_{1-x1}$As cladding layer 37. Also, the remaining thickness of the p-Al$_{x1}$Ga$_{1-x1}$As cladding layer 37 is set such that, in a passive feedback optical waveguide 6 having the narrow-width ridge stripe structure, the wave guiding with only the refractive index wave guiding in the fundamental transverse mode may be allowed.

The aforesaid insulating film is then removed, the p-GaAs contact layer 41 is grown, and the insulating film 42 is formed on the p-GaAs contact layer 41. Thereafter, the portion of the insulating film 42, which portion corresponds to the tapered stripe constituting an optical amplifier 7, is removed. Also, the p-side electrode 43 is formed on the insulating film 42 and the portion of the p-GaAs contact layer 41, which portion corresponds to the removed portion of the insulating film 42. Further, the n-side electrode 44 is formed on the bottom surface of the substrate 31.

Therefore, a current is not applied to the passive feedback optical waveguide 6 as in the first embodiment. The diffraction grating 10 is constituted such that a reflectivity as high as at least 50% can be achieved. The opposite end faces of the integrated optics semiconductor laser device are coated with anti-reflection coating films 9 and 9'.

In the integrated optics semiconductor laser device having the constitution described above, of the optical wave produced by the optical amplifier 7, only the optical wave having the wavelength defined by the diffraction grating 10 is reflected by the diffraction grating 10 and is returned to the optical amplifier 7. Also, the optical wave controlled in the single fundamental mode in the passive feedback optical waveguide 6 impinges upon the optical amplifier 7 at a certain angle of diffraction, and is amplified by the optical amplifier 7. A laser beam having a high intensity is thereby radiated while the single transverse mode is being kept.

The cladding layer 37 formed in the ridge stripe-like shape has a composition such that its refractive index may be larger than the refractive index of the selectively embedded layer 39, which is located on opposite sides of the cladding layer 37. Therefore, the optical wave, which is amplified by the optical amplifier 7, is approximately confined in the region within the ridge width of the cladding layer 37 and guided with the refractive index wave guiding through the active layer 34.

In this integrated optics semiconductor laser device, when the ridge stripe is formed, the insulating film having the unevenness at the side edges as described above is used as the mask. Therefore, fine unevenness 37a is formed on the side surfaces of the tapered portion of the cladding layer 37, which side surfaces extend in the direction along which the optical wave is guided. Since the unevenness 37a is thus formed, when the optical wave returning from the optical wave radiating end face of the optical amplifier 7 (i.e., the end face coated with the anti-reflection coating film 9') impinges upon the uneven side surfaces of the cladding layer 37, the returning optical wave is scattered by the uneven side surfaces of the cladding layer 37, and the intensity of the returning optical wave is lost. As a result, the resonance mode of the returning optical wave does not occur. Accordingly, the oscillation in the fundamental transverse mode is not disturbed by the resonance mode of the returning optical wave, the fundamental transverse mode can be kept even under the conditions for radiating a laser beam having a high intensity, and the diffraction limit optical wave can be produced.

Figure 10:
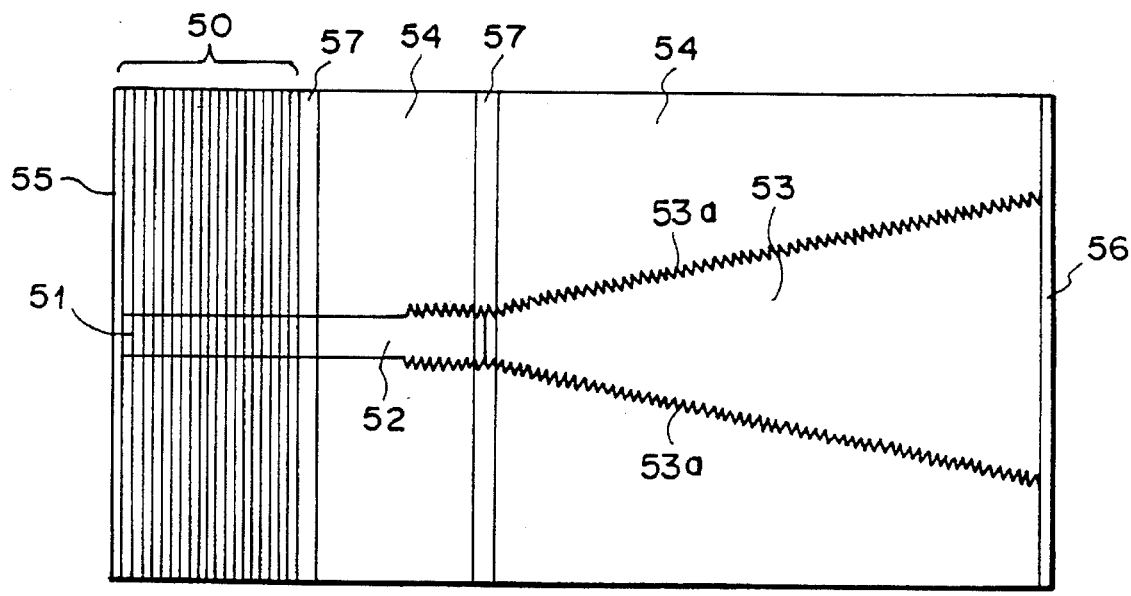
FIG. 10 is a schematic plan view showing a third embodiment of the integrated optics semiconductor laser device in accordance with the present invention.

A third embodiment of the integrated optics semiconductor laser device in accordance with the present invention will be described hereinbelow with reference to FIG. 10. FIG. 10 is a schematic plan view showing the third embodiment of the integrated optics semiconductor laser device in accordance with the present invention. The basic layer constitution in the third embodiment is the same as those in the first and second embodiments described above. The refractive index wave guiding is enabled by a selectively embedded region 54.

The third embodiment of the integrated optics semiconductor laser device is provided with a DFB laser (which may be replaced by a DBR laser or a passive feedback optical waveguide) 51 having a diffraction grating 50, an optical pre-amplifier 52, and an optical amplifier 53 having a tapered refractive index optical waveguide, which has unevenness 53a formed on the side surfaces. The optical pre-amplifier 52 may be a parallel refractive index optical waveguide and may be provided with unevenness at portions of the side surfaces. The DFB laser 51, the optical pre-amplifier 52, and the optical amplifier 53 are separated from one another by element separating regions 57, 57 such that they may have independent electrical contacts only on the stripe. The DFB laser 51, the optical pre-amplifier 52, and the optical amplifier 53 can thus be driven independently. The opposite end faces of the integrated optics semiconductor laser device are coated with anti-reflection coating films 55 and 56.

Also with the third embodiment, wherein the unevenness 53a is formed on the side surfaces of the tapered refractive index optical waveguide, as in the first and second embodiments described above, the occurrence of the resonance mode of the returning optical wave can be restricted. Accordingly, the fundamental transverse mode can be kept even under the conditions for radiating a laser beam having a high intensity, and the diffraction limit optical wave can be produced.

In the embodiments described above, the n-type substrate is employed. Alternatively, a p-type substrate may be employed. In such cases, the same effects can be obtained. Also, a quantum well structure or a strained quantum well structure may be employed for the active layer. Further, the DFB laser employed in the embodiments described above may be replaced by a distributed Bragg-reflector (DBR) laser.

In the aforesaid embodiments, the structure referred to as SQW-SCH, wherein a single quantum well is employed and the compositions of the optical waveguide layers are identical with each other, is employed. Alternatively, in lieu of the SQW structure, an MQW structure provided with a plurality of quantum wells may be employed.

As for the materials, it is possible to employ AlGaAs and InAlGaAsP materials, which are lattice matched with the GaAs substrate, an InAlGaAsP material, which is lattice matched with an InP substrate, and the like.

In cases where the optical waveguide is formed as the ridge structure, an etching inhibiting layer may be located in order to control the depth of the etching. Also, the ridge may be constituted such that it may penetrate through the active layer, and an optical waveguide stripe may be constituted by a p-n-p embedded structure. Further, as the crystal growth method, it is also possible to employ, for example, the molecular-beam epitaxial growth method utilizing a solid or a gas as the raw material.

What is claimed is:

1. An integrated optics semiconductor laser device comprising:

i) a light emitting means for outputting a beam of light, ii) a diffraction grating for controlling the wavelength of said beam of light, and iii) an optical amplifier, which has a tapered portion, that confines an optical wave therein, and in which said optical wave is guided with refractive index wave guiding through an active medium, wherein unevenness is formed on side surfaces of said tapered portion, said side surfaces extending in a direction along which said optical wave is guided, said unevenness of said side surfaces operating to scatter an optical wave returning from an optical wave radiating end face of said optical amplifier.

2. The integrated optics semiconductor laser device as defined in claim 1, wherein a cladding layer, which is formed on the side outward from one optical waveguide layer of optical waveguide layers located with said active medium interleaved therebetween, constitutes said tapered portion.

3. The integrated optics semiconductor laser device as defined in claim 1, wherein one optical waveguide layer of optical waveguide layers, which are located with said active medium interleaved therebetween, constitutes said tapered portion.

4. The integrated optics semiconductor laser device as defined in claim 1, wherein said active medium is formed in a tapered shape and constitutes said tapered portion.

5. The integrated optics semiconductor laser device as defined in claim 1, wherein said light emitting means comprises a master generator.

6. The integrated optics semiconductor laser device as defined in claim 1, wherein said light emitting means comprises the active medium portion of said optical amplifier.

* * * * *